United States Patent
Mu et al.

(10) Patent No.: US 9,343,172 B2
(45) Date of Patent: May 17, 2016

(54) EXTENDED PROTECTION FOR EMBEDDED ERASE OF NON-VOLATILE MEMORY CELLS

(71) Applicants: Fuchen Mu, Austin, TX (US); Chen He, Austin, TX (US); Yanzhuo Wang, Austin, TX (US)

(72) Inventors: Fuchen Mu, Austin, TX (US); Chen He, Austin, TX (US); Yanzhuo Wang, Austin, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 141 days.

(21) Appl. No.: 13/965,731

(22) Filed: Aug. 13, 2013

(65) Prior Publication Data
US 2015/0049555 A1  Feb. 19, 2015

(51) Int. Cl.
*G11C 11/34* (2006.01)
*G11C 16/34* (2006.01)
*G11C 16/14* (2006.01)

(52) U.S. Cl.
CPC ............ *G11C 16/3459* (2013.01); *G11C 16/14* (2013.01); *G11C 16/345* (2013.01)

(58) Field of Classification Search
CPC ... G11C 16/3459; G11C 16/14; G11C 16/345
USPC ........................................ 365/185.22, 185.21
See application file for complete search history.

(56) References Cited

U.S. PATENT DOCUMENTS

| | | | |
|---|---|---|---|
| 7,839,690 B2 | 11/2010 | Lee et al. | |
| 8,289,773 B2 | 10/2012 | Eguchi et al. | |
| 2003/0169622 A1* | 9/2003 | Ooishi et al. | 365/185.21 |
| 2007/0036007 A1* | 2/2007 | Lann | G11C 16/10 365/189.09 |
| 2008/0019164 A1* | 1/2008 | Hemink | G11C 16/344 365/100 |
| 2012/0327720 A1* | 12/2012 | Eguchi | G11C 16/0483 365/185.29 |

* cited by examiner

*Primary Examiner* — Richard Elms
*Assistant Examiner* — Mohammed A Bashar

(57) ABSTRACT

Methods and systems are disclosed for extended erase protection for non-volatile memory (NVM) cells during embedded erase operations for NVM systems. The embodiments described herein utilize an additional threshold voltage (Vt) check after soft programming operation within an embedded erase operation completes to provide extended erase protection of NVM cells. In particular, the threshold voltages for NVM cells are compared against a threshold voltage (Vt) check voltage ($V_{CHK}$) level and an additional embedded erase cycle is performed if any NVM cells are found to exceed the threshold voltage (Vt) check voltage ($V_{CHK}$) level. The threshold voltage (Vt) check voltage ($V_{CHK}$) level can be, for example, a voltage level that is slightly higher than an erase verify voltage ($V_{EV}$) level and lower than read voltage level ($V_R$).

24 Claims, 7 Drawing Sheets

EXTENDED PROTECTION FOR EMBEDDED ERASE OF NON-VOLATILE MEMORY CELLS

TECHNICAL FIELD

This technical field relates to non-volatile memory (NVM) systems and, more particularly, to embedded erase operations for NVM cells within NVM systems.

BACKGROUND

Non-volatile memory (NVM) systems including arrays of NVM cells are used in a variety of electronic systems and devices. During the operation of an NVM system, NVM cells are often erased using an embedded erase process that includes a number of steps. Certain events during embedded erase operations, such as brown-out events and/or cells that are slow to erase, can leave a portion of the NVM cells in charge states that can cause problems in subsequent operations for the NVM system.

FIG. 1 (Prior Art) is a flow diagram of an embodiment 100 for an embedded erase operation for NVM cells within an NVM array for an NVM system. The embedded erase operation starts in block 102 and proceeds to block 104 where a determination is made whether column leakage currents for the NVM array are below a predetermined threshold. If "NO," then flow passes directly to erase verify determination block 110. If "YES," then flow passes to block 106 where a program verify determination is made. The program verify determination in block 106 determines whether the threshold voltage levels for the NVM cells exceed a program verify voltage level. If "YES," then flow passes to block 110. If "NO," then flow passes to block 108 where a pre-program pulse is applied to the NVM cells that failed program verify. The pre-program pulse adds charge to the charge storage layers within the NVM cells. Flow then passes to block 110, or if desired, flow can pass back to determination block 106 wherein a program verify determination is again made. Once determination block 110 is reached, an erase verify determination is performed. The erase verify determination in block 110 determines whether the threshold voltage levels for the NVM cells fall below an erase verify voltage level. If "YES," then flow passes to determination block 114. If "NO," then flow passes to erase block 112 where an erase pulse is applied to all the NVM cells in the array. The erase pulse removes charge from the charge storage layers within the NVM cells. Flow then passes back to determination block 110 wherein an erase verify determination is again made. Once determination block 114 is reached, a soft program verify operation is performed. The soft program verify determination in block 114 determines whether the threshold voltage levels for the NVM cells exceed a soft program verify voltage level. If "NO," then flow passes to soft program block 116 where a soft program pulse is applied to the NVM cells that failed soft program verify. The soft program pulse adds charge to the charge storage layers within the NVM cells using weaker bias voltage than program pulse. Flow then passes back to determination block 114 wherein a soft program verify determination is again made. Once all cells pass the soft program verify in determination block 114 and the determination is "YES," then flow passes to block 118 where the embedded erase process finishes.

For the embedded erase embodiment 100, therefore, after all the cells pass erase verify in block 114, soft program pulses will be applied in block 116 if any of the cells fall below the soft program verify voltage. If any cell then still fails soft program verify in block 114, soft program pulses will again be applied to the failing cells in block 116, and this will continue until all cells pass soft program verify in block 114. Once all cells pass, embedded erase is done and block 118 is reached. In some cases, however, a large number of soft program pulses may be required before block 118 is reached. For example, a large number of over-erased cells can exist that require extensive soft program pulses before all cells are recovered and pass the soft program verify determination in block 114. A large number of over-erased cells can occur, for example, when embedded erase operations are interrupted (e.g., by a brown-out) before the soft program operation in blocks 114 and 116 completes. Further, a large number of over-erased cells can be generated where intermittent slow erase cells lead to a large number of additional erase pulses being applied to the NVM cells before all cells will pass the erase verify determination in block 110. Using large numbers of soft programming pulses to satisfy soft programming verify in block 114, however, can lead to disturbed or over-soft-programmed cells that have threshold voltage levels that significantly exceed the erase verify level and hence have less normal read margin. Such disturbed or over-soft-programmed cells can lead to latent read failures and induce potential reliability issues.

FIG. 2 (Prior Art) is a probability distribution diagram of an embodiment 200 for threshold voltages of the NVM cells having a large number of over-erased cells. The x-axis 204 represents threshold voltage (Vt), and the y-axis 202 represents numbers of cells at the threshold voltage levels. Curve 214 represents a probability distribution curve for cells within an NVM cell array where a large portion 216 of the cells are over-erased and have threshold voltages that fall below the soft program verify voltage ($V_{SPV}$) level 206. It is noted that voltage level 206 represents a soft-program verify voltage ($V_{SPV}$) level used during soft-program verify operations. Voltage level 208 represents an erase verify voltage ($V_{EV}$) level used during erase verify operations. Voltage level 212 represents a program verify voltage ($V_{PV}$) level used during pre-program verify operations. And voltage level 210 represents a read voltage level ($V_R$) used during read operations. For read operations, if the threshold voltage level of the accessed cell is above the read gate bias voltage ($V_R$) 210, the NVM cell is determined to be programmed (e.g., logic 0). If the threshold voltage level of the accessed cell is below the read gate bias voltage ($V_R$) 210, the NVM cell is determined to be erased (e.g., logic 1).

FIG. 3 (Prior Art) is a probability distribution diagram of an embodiment 300 for threshold voltages of the NVM cells having disturbed or over-soft-programmed cells after soft program operation has been performed on the cell distribution of embodiment 200. In particular, as shown in embodiment 300, soft program operations have adjusted the threshold voltages for the NVM cells such that the prior distribution curve 214 has been adjusted to new distribution curve 302. All of the cells now have threshold voltage levels that exceed the soft program verify voltage ($V_{SPV}$) level 206. As such, the cells will pass soft program verify in determination block 114 described above. However, as also described above, when a large number of soft program pulses are utilized to move the voltage distribution curve 214 so that all cells will rise above the soft program verify voltage ($V_{SPV}$) level 206, a number of disturbed or over-soft-programmed cells 304 can be generated that have threshold voltages that exceed the erase verify voltage ($V_{EV}$) level 208. These cells with elevated threshold voltages above the erase verify voltage ($V_{EV}$) level decrease read margin and induce potential read failures. Further, some of these disturbed or over-soft-programmed cells 304 can also have threshold voltages that extend above the read voltage ($V_R$) level 210 thus induce read error, as well.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale.

DETAILED DESCRIPTION

Figure 1:
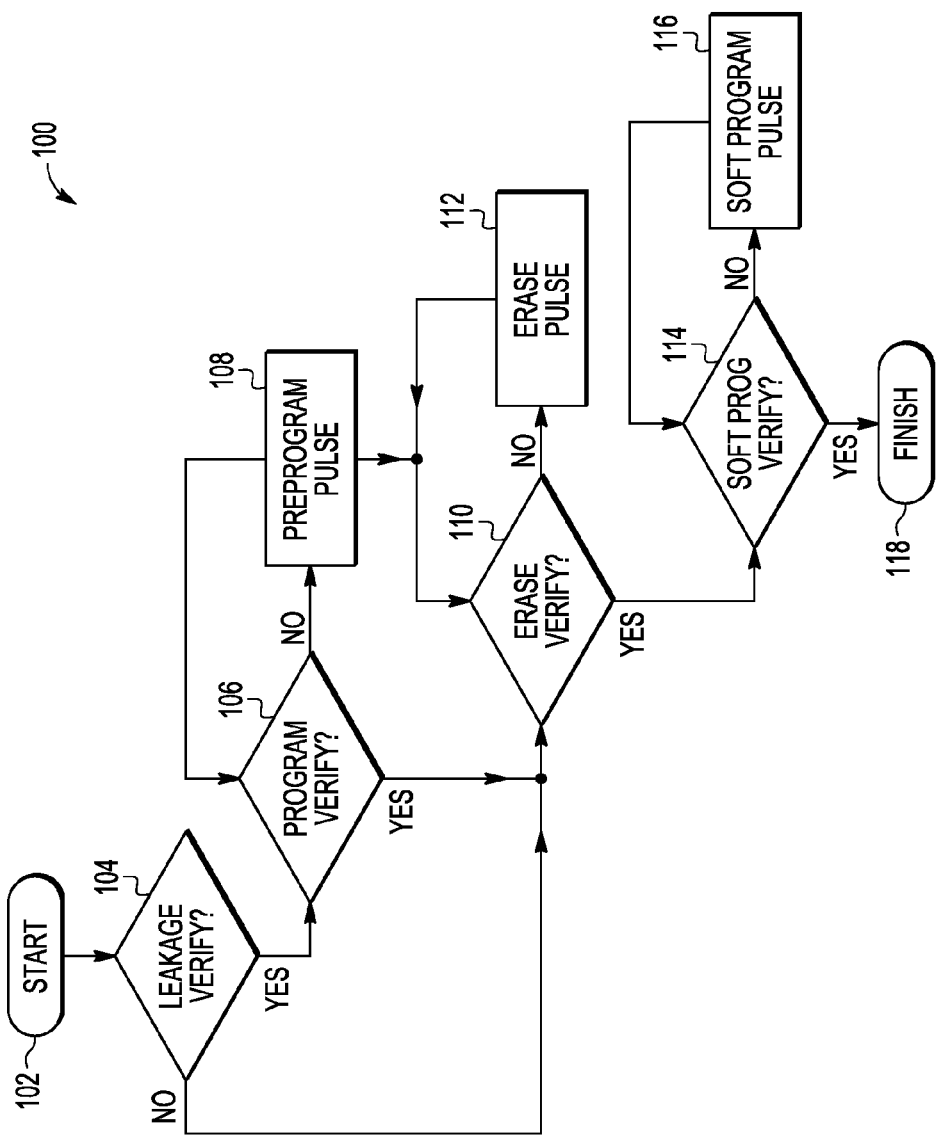
FIG. 1 (Prior Art) is a flow diagram of an embodiment for an embedded erase process for NVM cells within an NVM array for an NVM system.

Methods and systems are disclosed for extended erase protection for non-volatile memory (NVM) cells during embedded erase operations for NVM systems. The embodiments described herein utilize an additional threshold voltage (Vt) check after soft programming operations for embedded erase operations to provide extended erase protection of NVM cells. In particular, the threshold voltages for NVM cells are compared against a threshold voltage (Vt) check voltage ($V_{CHK}$) level and an additional embedded erase cycle is performed if NVM cells are found to exceed the threshold voltage (Vt) check voltage ($V_{CHK}$) level. The threshold voltage (Vt) check voltage ($V_{CHK}$) level can be, for example, a voltage level that is slightly higher than an erase verify voltage ($V_{EV}$) level. After the additional embedded erase cycle (e.g., one additional pre-program, erase, and soft program operation), the NVM cells are again compared against the threshold voltage (Vt) check voltage ($V_{CHK}$) level. If a second failure occurs, the embedded erase can be deemed a failure. It is noted, however, that additional embedded erase cycles could also be utilized, if desired, prior to failing the embedded erase. Different features and variations can be implemented, as desired, and modified systems and methods can be utilized, as well.

By applying of the additional threshold voltage (Vt) check during embedded erase operations, the disclosed embodiments provide extended erase protection of NVM cells by addressing potential problems generated by NVM cells having elevated threshold voltages after traditional embedded erase operations have completed. Without the additional threshold voltage (Vt) check, soft programming operations for embedded erase operations can produce NVM cells that exceed the erase verify voltage ($V_{EV}$) level by a large enough amount that subsequent read failures will occur, thereby degrading the reliability of the NVM system. For example, as described above, where operational conditions have left large numbers of over-erased NVM cells, a large number of soft program pulses can be needed for the NVM cells to pass soft program verify determinations. This large number of soft program pulses can lead to disturbed or over-soft-programmed NVM cells that significantly exceed the erase verify voltage ($V_{EV}$) level. As also indicated above, large numbers of over-erased NVM cells can occur where brown-out events cause soft program operations within an embedded erase to end prior to completion. In this case, in the following embedded erase operation, the column leakage verify will likely fail and erase verify will pass. Thus the embedded erase operation will proceed directly to the soft program operation with large number of over-erased NVM cells in the array. Further, one or more cells that are slow to erase can also lead to large numbers of other NVM cells becoming over-erased as more erase pulses are applied to all the NVM cells to erase the slow cells as compared to the case which has no slow to erase cells. It is a common design feature that the erase pulse is a bulk operation that is applied to all the NVM cells in the selected NVM array. Other operational events may also produce large numbers of over-erased NVM cells. The additional threshold voltage (Vt) check as described herein helps to alleviate potential reliability problems that would otherwise be created by having NVM cells with elevated threshold voltages after completion of traditional embedded erase operations.

Figure 4:
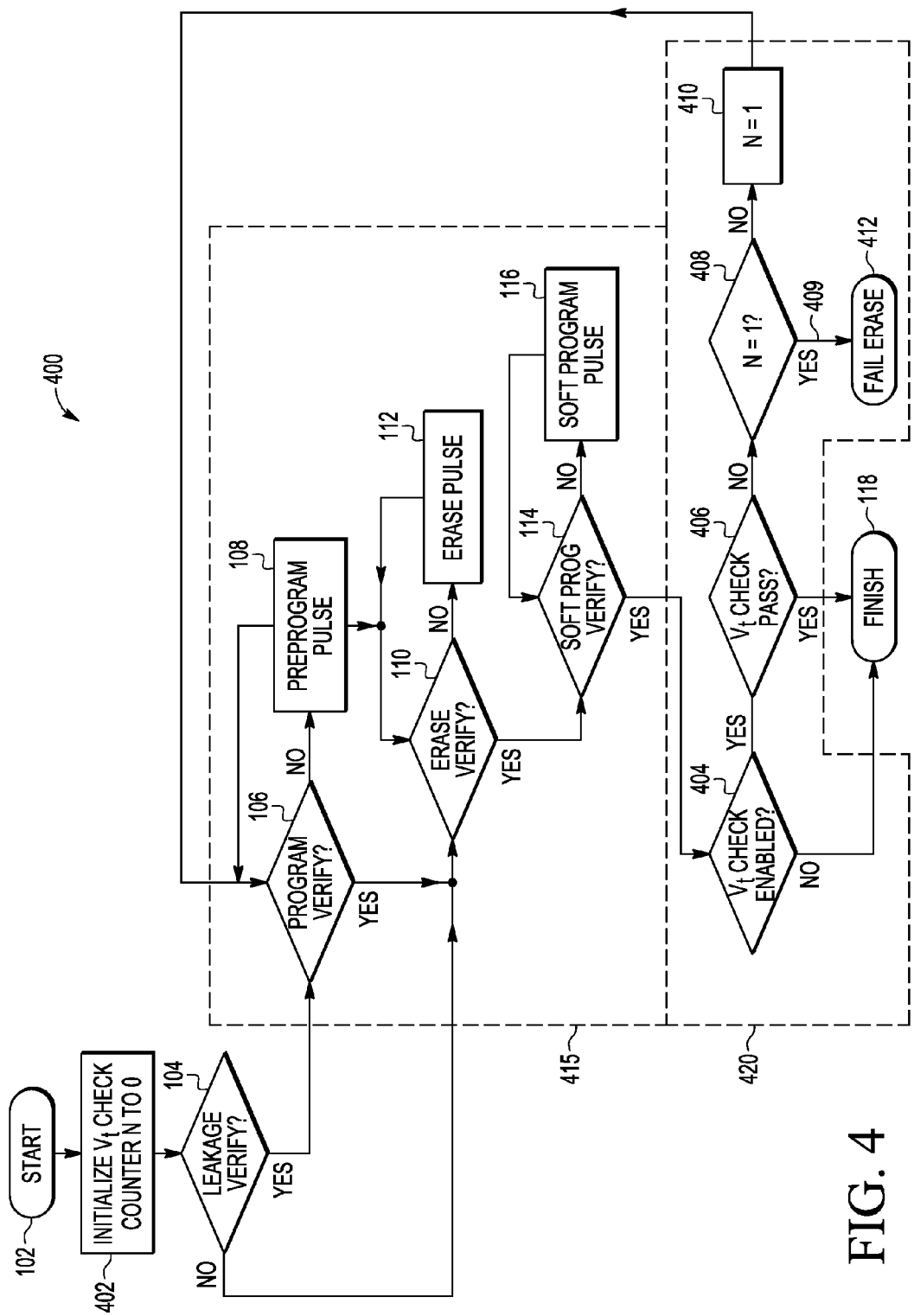
FIG. 4 is a flow diagram of an embodiment including an additional threshold voltage check protection scheme for embedded erase operations for NVM cells within an NVM system.

FIG. 4 is a flow diagram of an embodiment 400 including additional threshold voltage check protection scheme for an embedded erase operation for NVM cells within an NVM array for an NVM system. The embedded erase process starts in block 102, and then block 402 is reached where a threshold voltage (Vt) check counter is initialized to zero (N=0). Block 104 is then reached. From block 104 to determination block 114, the embodiment 400 is the same as embodiment 100 of FIG. 1 (Prior Art). However, in contrast to embodiment 100, an additional threshold voltage (Vt) check operation 420 is conducted in embodiment 400 that helps to protect NVM cells from having threshold voltage levels that are too high after the soft program operation has concluded within the embedded erase steps 415.

Looking in more detail to threshold voltage (Vt) check operation 420, determination block 404 is first reached in embodiment 400 after all NVM cells pass the soft program verify determination in block 114. In block 404, a determination is made whether the threshold voltage (Vt) check process has been enabled. If "NO," then flow passes to block 118 where the embedded erase operation completes. If "YES," then flow passes to block 406 where the threshold voltage (Vt) for NVM cells are checked to see if they fall below a threshold voltage (Vt) check voltage ($V_{CHK}$) level, as described further below. If "YES," then flow passes to block 118 where the embedded erase operation ends. If "NO," then flow passes to block 408 where a determination is made whether the threshold voltage (Vt) check counter (N) is already set to one (N=1) or is still set to its initial value of zero (N=0). If the threshold voltage (Vt) check counter (N) is already set to one (N=1) and the determination is "YES," then flow passes to block 412 where the embedded erase operation is indicated as a failure. If the threshold voltage (Vt) check counter (N) is still set to zero (N=0) and the determination is "NO," then flow passes to block 410 where the threshold voltage (Vt) check counter (N) is set to one (N=1). Flow then passes to determination block 106 to allow the embedded erase operation 415 to be repeated. It is noted that Fowler-Nordheim (FN) tunneling and hot carrier injection (HCI) techniques can be used to perform the erase and program operations for the NVM cells, respectively, if desired, although other erase and program techniques could also be utilized, if desired.

As indicated above, by applying the additional threshold voltage (Vt) check operation 420 during embedded erase operations and thereby giving the NVM cells a second chance of repeating the embedded erase steps 415 if the check fails, the disclosed embodiments provide extended erase protection of NVM cells by addressing potential problems generated by NVM cells having elevated threshold voltages after traditional embedded erase operations have completed. FIGS. 5-8 provide probability distribution diagrams that show this result achieved by the additional threshold voltage (Vt) check operation 420.

Figure 3:
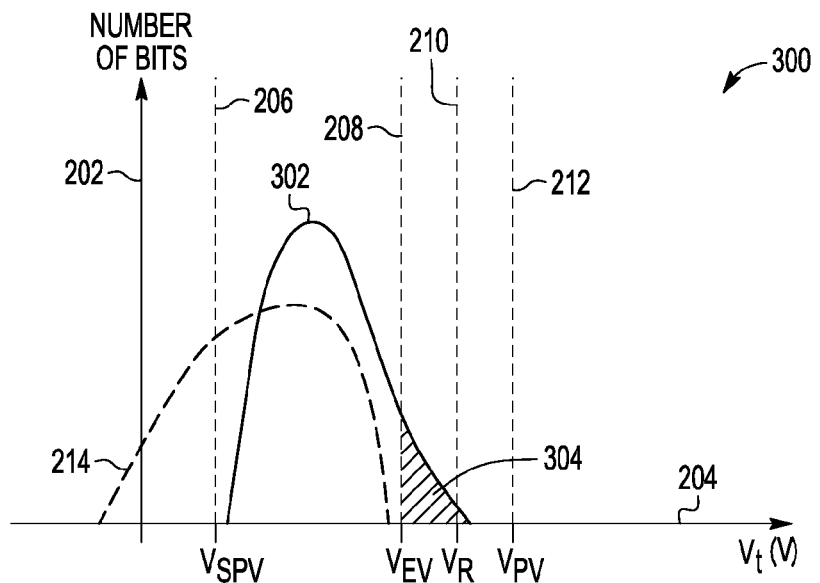
FIG. 3 (Prior Art) is a probability distribution diagram of an embodiment for threshold voltages of the NVM cells having disturbed or over-soft-programmed cells after soft program operations are applied to the cell distribution of FIG. 2 (Prior Art).
Figure 5:
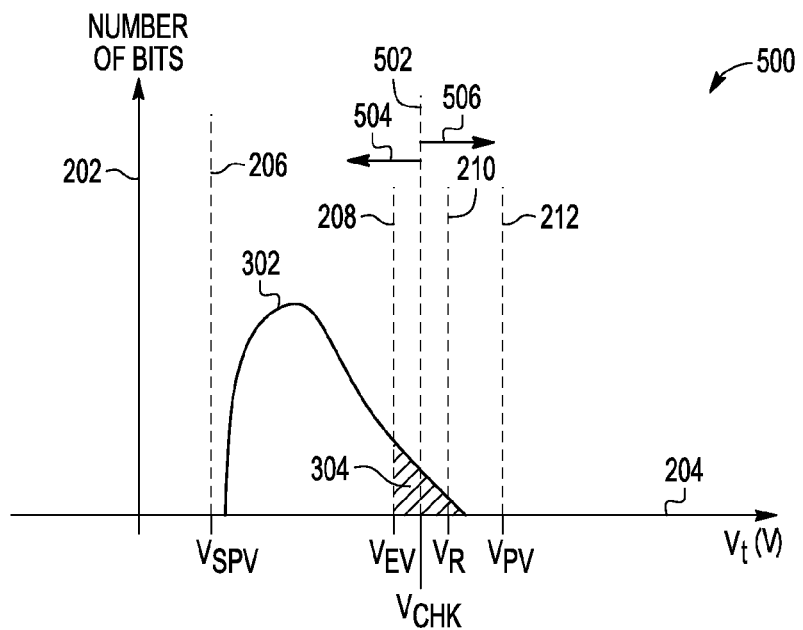
FIG. 5 is a probability distribution diagram of an embodiment for threshold voltages of the NVM cells where a threshold voltage (Vt) check is being applied.

FIG. 5 is a probability distribution diagram of an embodiment 500 for threshold voltages of the NVM cells where a threshold voltage (Vt) check is being applied. The x-axis 204 represents threshold voltage (Vt), and the y-axis 202 represents numbers of cells at the threshold voltage levels. As with FIG. 3 (Prior Art), curve 302 represents a probability distribution curve for NVM cells where a number of disturbed or over-programmed cells 304 exist that exceed the erase verify voltage ($V_{EV}$) level 208 and some of which also exceed the read verify voltage ($V_R$) 210. Also as with FIG. 3 (Prior Art), embodiment 500 shows the soft-program verify voltage ($V_{SPV}$) level 206, the erase verify voltage ($V_{EV}$) level 208, and the program verify voltage ($V_{PV}$) level 212. In contrast with prior solutions, however, a threshold voltage (Vt) check voltage ($V_{CHK}$) level 502 is being used to check the threshold voltage (Vt) levels of the NVM cells after soft program operation has completed. The threshold voltage (Vt) check voltage ($V_{CHK}$) level 502 is higher than the erase verify voltage ($V_{EV}$) level 208 and lower than the read verify voltage ($V_R$) level 210. For example, threshold voltage (Vt) check voltage ($V_{CHK}$) level 502 can be about 200 millivolts (mV) or less above the erase verify voltage ($V_{EV}$) level 208. This threshold voltage (Vt) check voltage ($V_{CHK}$) level 502 can be adjusted higher or lower, if desired, as represented by arrows 504 and 506.

In operation, as described above with respect to embodiment 400 of FIG. 4, if there are NVM cells having a threshold voltage (Vt) above the threshold voltage (Vt) check voltage ($V_{CHK}$) level 502, the additional threshold voltage (Vt) check operation will fail and the embedded erase steps (e.g., pre-program, erase, soft program) will be repeated once (i.e., until N=1) in order to adjust these cell threshold voltage levels. As shown in embodiment 500, there are a portion 304 of the NVM cells with elevated voltages that have threshold voltage (Vt) levels above the threshold voltage (Vt) check voltage level 502. As such, the embedded erase steps will be repeated as shown with respect to FIGS. 6-8.

Figure 6:
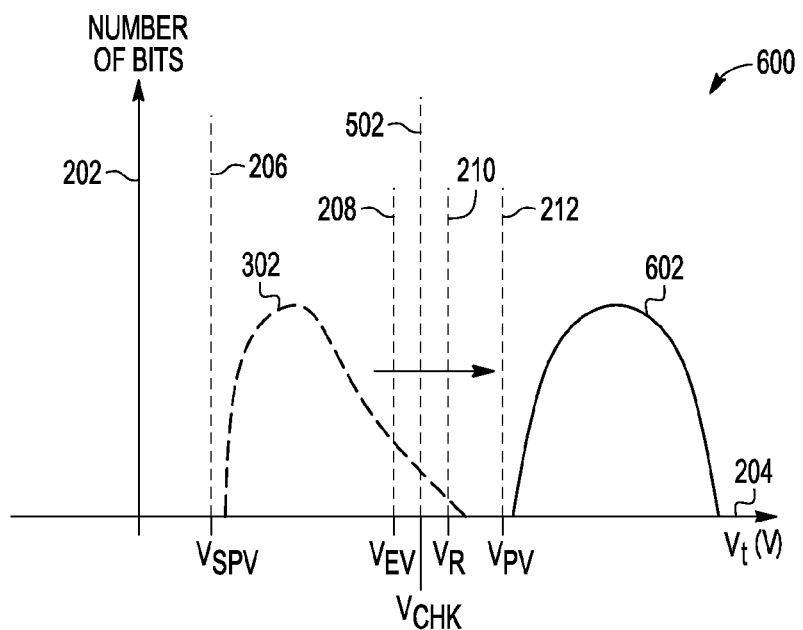
FIG. 6 is a probability distribution diagram of an embodiment for threshold voltages of the NVM cells where pre-program operations have been performed on the cell distribution of FIG. 5.

FIG. 6 is a probability distribution diagram of an embodiment 600 for threshold voltages of the NVM cells where pre-program operation has been performed on the cell distribution of embodiment 500. In particular, as shown in embodiment 600, pre-program operation has adjusted the threshold voltages for the NVM cells such that the prior distribution curve 302 has been adjusted to new distribution curve 602. All of the cells now have threshold voltage levels that exceed the program verify voltage ($V_{PV}$) level 212. As such, the cells will pass the program verify determination step 106 described above, and erase pulse will then be applied as the voltage levels for the cells exceed the erase verify voltage ($V_{EV}$) level 208.

Figure 2:
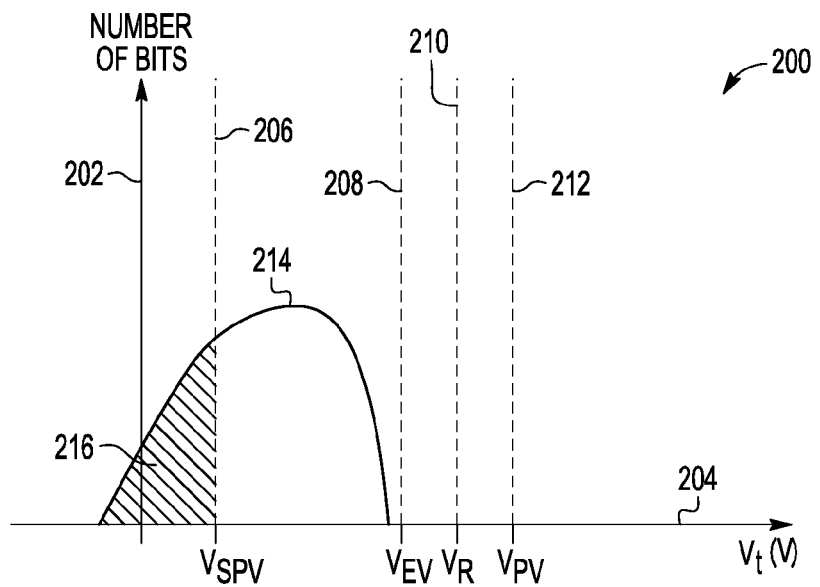
FIG. 2 (Prior Art) is a probability distribution diagram of an embodiment for threshold voltages of the NVM cells having a large number of over-erased cells.
Figure 7:
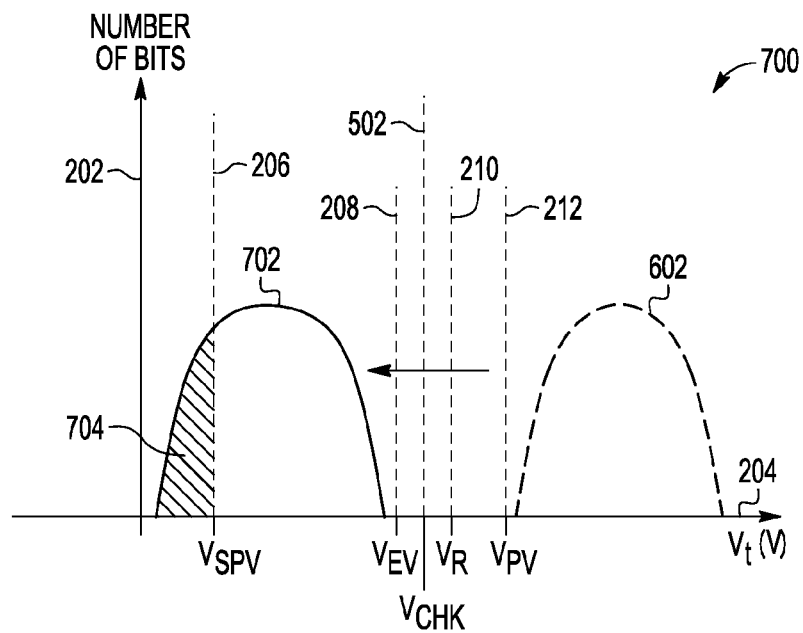
FIG. 7 is a probability distribution diagram of an embodiment for threshold voltages of the NVM cells where erase operations have been performed on the cell distribution of FIG. 6.

FIG. 7 is a probability distribution diagram of an embodiment 700 for threshold voltages of the NVM cells where an erase operation has been performed on the cell distribution of embodiment 600. In particular, as shown in embodiment 700, the erase operation has adjusted the threshold voltages for the NVM cells such that the prior distribution curve 602 has been adjusted to new distribution curve 702. All of the cells now have threshold voltage levels that are below the erase verify voltage ($V_{EV}$) level 208. As such, the cells will pass the erase verify determination step 110 described above. However, a portion 704 of the cells have voltage levels below the soft program verify voltage ($V_{SPV}$) level 206. As such, soft program operation will then be performed. It is noted that, as compared to the distribution curve 214 in FIG. 2 (Prior Art) with a large number of over-erased cells, the number of cells on curve 702 having voltage levels below the soft program verify voltage ($V_{SPV}$) level 206 is much less (i.e., a much smaller number of over-erased cells). Thus the number of soft program pulses required to move the over-erased cells above soft program verify voltage ($V_{SPV}$) level 206 on curve 702 will be much less, and the probability of producing disturbed or over-soft-programmed cells with threshold voltage above the erase verify voltage ($V_{EV}$) level 208 after soft program operation is much reduced.

Figure 8:
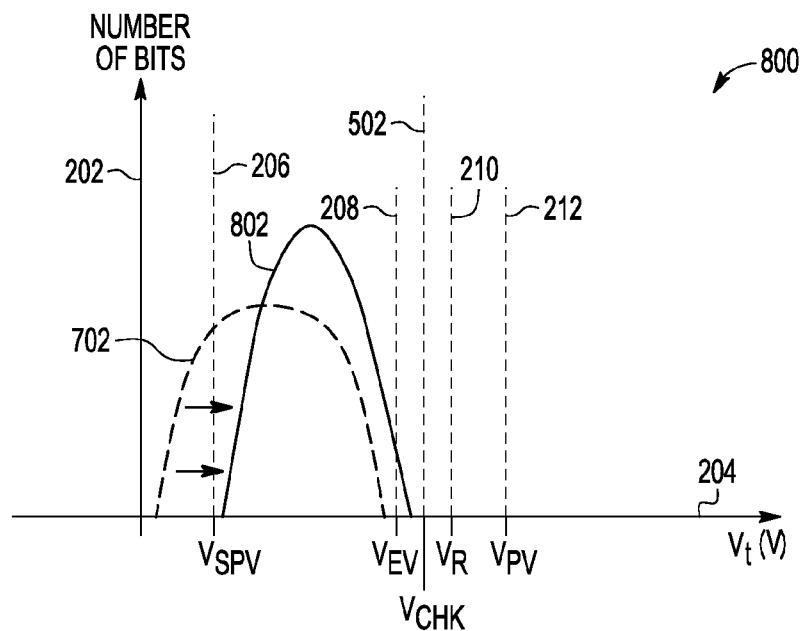
FIG. 8 is a probability distribution diagram of an embodiment for threshold voltages of the NVM cells where soft program operations have been performed on the cell distribution of FIG. 7.

FIG. 8 is a probability distribution diagram of an embodiment 800 for threshold voltages of the NVM cells where soft program operation has been performed on the cell distribution of embodiment 700. In particular, as shown in embodiment 800, soft program operation has adjusted the threshold voltages for the NVM cells such that the prior distribution curve 702 has been adjusted to new distribution curve 802. All of the cells now have threshold voltage levels that are above the soft program verify voltage ($V_{SPV}$) level 206 but still below the threshold voltage (Vt) check voltage ($V_{CHK}$) level 502. As such, the NVM cells will pass the soft program verify determination step 114, and the NVM cells will also pass the threshold voltage (Vt) check 406. The embedded erase process will then pass to finish block 118 as shown in FIG. 4.

It is noted that resulting distribution curve 802 does show NVM cells above the erase verify voltage ($V_{EV}$) 208. Preferably, all of the NVM cells will have threshold voltage levels that are below the erase verify voltage ($V_{EV}$) 208. However, if some threshold voltage levels exceed the erase verify voltage ($V_{EV}$) 208 by a relatively small amount, subsequent read errors are unlikely to occur. As indicated above, the threshold voltage (Vt) check voltage ($V_{CHK}$) level 502 can be set relatively close to the erase verify voltage ($V_{EV}$) 208, such as within about 200 mV. Further, as described above, the threshold voltage (Vt) check voltage ($V_{CHK}$) level 502 can be adjusted higher or lower depending upon what voltage level is desired for triggering a failure of the threshold voltage (Vt) check determination in block 406. For example, the threshold voltage (Vt) check voltage ($V_{CHK}$) level 502 could be set as low as the erase verify voltage ($V_{EV}$) 208, and the threshold voltage (Vt) check voltage ($V_{CHK}$) level 502 could be set as high as the read voltage ($V_R$) level, if desired. Other settings could also be utilized, as desired.

Figure 9:
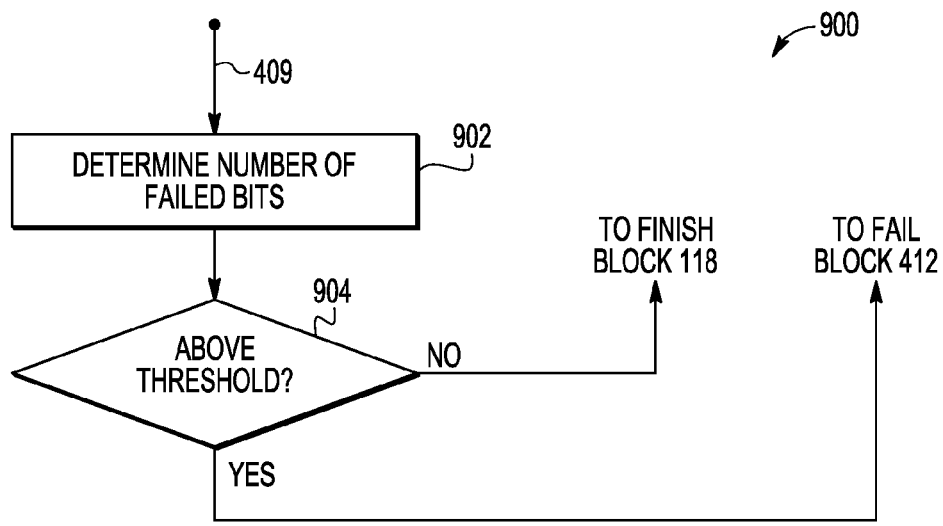
FIG. 9 is a flow diagram for a further embodiment where a check is made concerning a number of failing cells prior to failing the embedded erase.

FIG. 9 is a flow diagram for a further embodiment where a check is made concerning a number of failing cells prior to failing the embedded erase due to a failure of the threshold voltage (Vt) check determination in block 406. Looking back to embodiment 400 of FIG. 4, it is seen that the process will pass along path 409 to fail block 412 if there are still NVM cells having threshold voltages above the threshold voltage (Vt) check voltage ($V_{CHK}$) level 502. However, with embodiment 900, path 409 first passes to block 902 where a number of failing cells is determined. Next, in block 904, this number of failing cells is compared against a predetermined threshold value to see if the number of failing cells exceeds this threshold value. If "NO," then flow passes to block 118 where the embedded erase is completed without indicating a failure. If "YES," then flow passes to block 412 where a failure is indicated for the embedded erase. The threshold value can be selected, for example, based upon a number of cells that can be corrected using error correction code (ECC) routines or other data correction processing available with respect to the NVM system. The embodiment 900 thereby allows for NVM system to successfully complete an embedded erase where potential read errors from elevated NVM cells would be correctable through subsequent error correction processing for the NVM system.

As described above, various voltage levels are utilized during NVM operations to compare against threshold voltage levels for NVM cells. For example, an erase verify voltage ($V_{EV}$) level 208, a read verify voltage ($V_R$) 210, a program verify voltage ($V_{PV}$) level 212, a soft-program verify voltage ($V_{SPV}$) level 214, and a threshold voltage (Vt) check voltage ($V_{CHK}$) level 502 are utilized. TABLE 1 below provides examples voltages that can be utilized for these voltage levels, although different voltage levels could also be utilized, if desired.

TABLE 1

EXAMPLE THRESHOLD VOLTAGES LEVELS

| Voltage | Example Voltage Level |
| --- | --- |
| Soft Program Verify ($V_{SPV}$) | 2.1 V |
| Erase Verify ($V_{EV}$) | 3.5 V |
| Vt Check ($V_{CHK}$) | 200 mV or less above $V_{EV}$ |
| Read Verify ($V_R$) | 4.2 V |
| Program Verify ($V_{PV}$) | 6.0 V |

Figure 10:
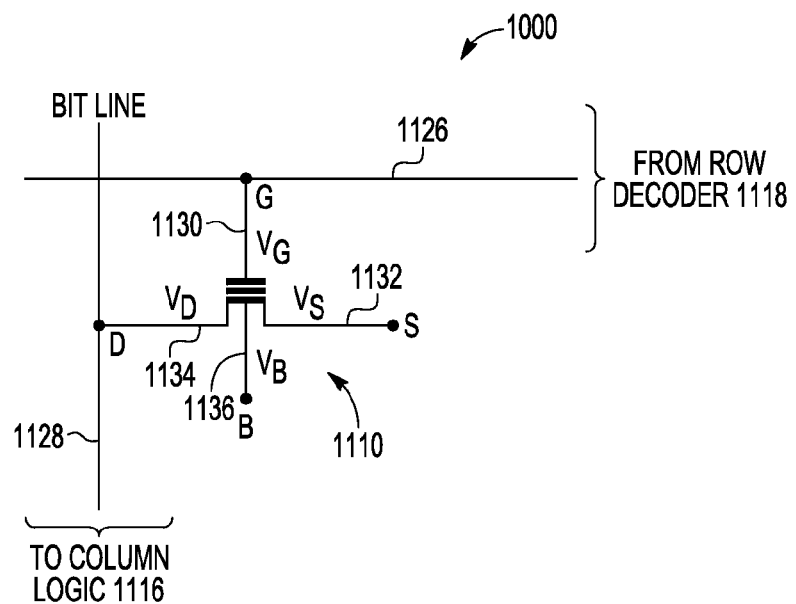
FIG. 10 is a connection diagram of an example embodiment for connections to a non-volatile memory (NVM) cell.
Figure 11:
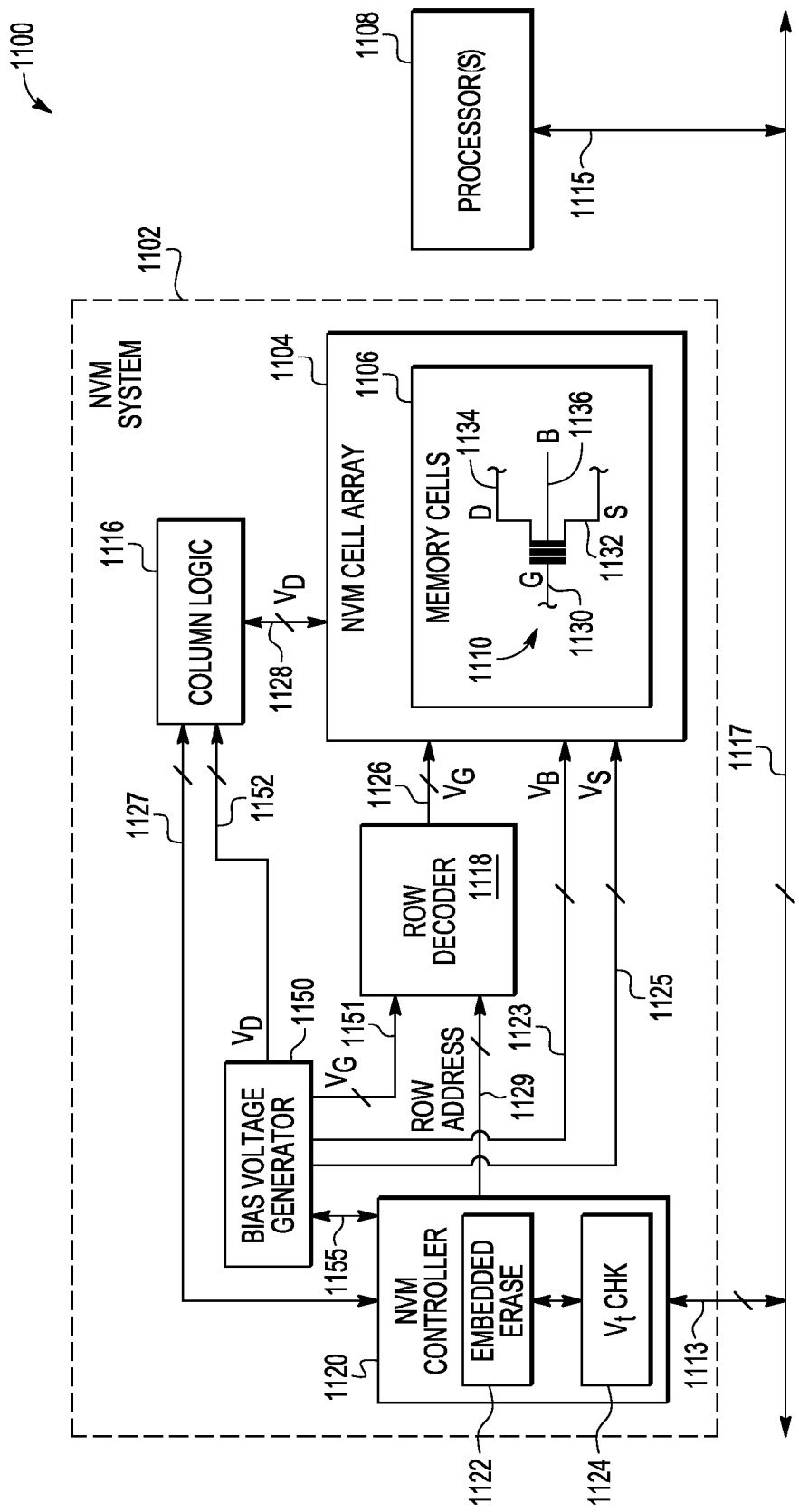
FIG. 11 is a block diagram of an integrated circuit including a non-volatile memory (NVM) system with an additional threshold voltage check protection scheme for embedded erase operations for NVM cells within an NVM system.

Now looking to FIG. 10 and FIG. 11, connections to NVM cells and an NVM system are shown, respectively, that can take advantage of the additional threshold voltage (Vt) check operation embodiments described herein.

FIG. 10 is a connection diagram of an example embodiment 1000 for connections to an NVM cell 1110. During an operation, the NVM memory cell 1110 has its body (B) 1136 connected to a body bias voltage ($V_B$) and has its source (S) 1132 connect to a source bias voltage ($V_S$), for example, as provided by the bias voltage generator 1150 as described below. The NVM cell 1110 has its drain (D) 1134 coupled to the column logic 1116 through one of the bit-line connections 1128 to receive a drain bias voltage ($V_D$). The NVM cell 1110 has its gate (G) 1130 coupled to the row decoder 1118 through one of the connections 1126 to receive a gate bias voltage ($V_G$). Depending upon the operation to be performed for the NVM memory cells 1104, different body, source, drain, and gate bias voltages ($V_B$, $V_S$, $V_D$, $V_G$) are applied to the body (B) nodes 1136, source (S) nodes 1132, drain (D) nodes 1134, and gate (G) nodes 1130 for selected NVM memory cells 1106. For the embodiment depicted, NVM cell 1110 is a floating gate type NVM memory cell. For a floating gate NVM cell, a control gate, a dielectric layer, a floating gate, and a tunnel dielectric layer will typically be located below the gate (G) node 1130 (e.g., gate electrode) and above the channel region within the semiconductor substrate upon which the floating gate NVM cell is fabricated. It is noted that other NVM cell types could also be utilized, such as split-gate NVM cells, multi-level NVM cells, and/or other types of NVM cells, if desired.

FIG. 11 is a block diagram of an integrated circuit 1100 including a non-volatile memory (NVM) system 1102 having an additional threshold voltage (Vt) check operation as described herein. For the embodiment depicted, the NVM controller 1120 utilizes the threshold voltage (Vt) check block 1124 to provide additional protection for NVM cells during embedded erase operations. The NVM controller 1120 utilizes the embedded erase block 1122 to perform NVM embedded erase operations. As also depicted, the NVM system 1102 and one or more processor(s) 1108 are coupled to a communication bus 1117 through connections 1113 and 1115, respectively. The NVM system 1102 also includes an NVM controller 1120, a row decoder 1118, column logic 1116, a bias voltage generator 1150, and an NVM cell array 1104. As further depicted, the NVM cell array 1104 includes a plurality of NVM cells 1106. Memory cell 1110 represents one of the plurality of NVM memory cells 1106.

It is noted that the NVM system 1102 can be integrated within a single integrated circuit with the one or more processors 1108, can be implemented as stand-alone memory integrated circuit, or can be implemented in another desired configuration, as desired. It is further noted that a programmable switch and/or a programmable register can be provided within the NVM system 1102 to control whether or not the threshold voltage (Vt) check process is enabled or disabled. Further, it is noted that a programmable register can be used to store the check counter (N), and this programmable register can be sized based upon the check counter (N) being used. For example, if a single additional cycle is being used, then a single-bit register can be used to store the check counter (N) that can then be a "1" or a "0" to indicate whether or not an additional cycle has already been done. If further additional embedded erase cycles are being used, then the check counter (N) and the programmable register can be larger respectively.

During operation, the NVM controller 1120 provides row addresses to the row decoder 1118 through connections 1129. The row decoder 1118 drives selected wordlines with gate bias voltages ($V_G$) 1126 applied to gate nodes 1130 for selected row(s) of NVM cells 1106 within the NVM cell array 1104. The NVM controller 1120 also provides column addresses to column logic 1116 through connections 1127. The column logic 1116 drives selected bit-lines with drain bias voltages ($V_D$) 1128 applied to drain nodes 1134 for selected column(s) of NVM cells 1106 within the NVM cell array 1104. The column logic 1116 is also used to access and read stored data values from the selected NVM cells 1106 within the NVM cell array 1104 through connections 1128.

The bias voltage generator 1150 is configured to generate a variety of bias voltages that are used for the operation of the NVM system 1102. For example, the bias voltage generator 1150 provides gate bias voltages 1151 to row decoder 1118 that are used to apply the gate bias voltages ($V_G$) 1126. The bias voltage generator 1150 also provides drain bias voltages 1152 to column logic 1116 that are used to apply the drain bias voltages ($V_D$) 1128. Further, the bias voltage generator 1150 provides body bias voltages ($V_B$) 1123 to body nodes 1136 for the NVM cells 1106 within the NVM cell array 1104, and the bias voltage generator 1150 provides source bias voltages ($V_S$) 1125 to source nodes 1132 for the NVM cells 1106 within the NVM cell array 1104. The bias voltage generator 1150 receives bias control signals 1155 from the NVM controller 1120 that control the bias voltages that are provided by the bias voltage generator 1150. It is further noted that the bias voltage generator 1150 can be implemented as a single circuit block or as circuit blocks distributed in different locations throughout the NVM system 1102, as desired. Other variations could also be implemented, if desired.

As described herein, a variety of embodiments can be implemented and different features and variations can be implemented, as desired.

In one embodiment, a method is disclosed for erasing non-volatile memory (NVM) cells within an NVM system including performing an embedded erase operation for non-volatile memory (NVM) cells where the embedded erase operation includes erasing the NVM cells until the NVM cells have threshold voltages below an erase verify voltage level and soft programming the NVM cells until the NVM cells have threshold voltages above a soft program verify voltage level, comparing the threshold voltages for the NVM cells to a check voltage level where the check voltage level is higher than an erase verify voltage level, and repeating the performing step based upon results of the comparing step.

In other embodiments, the repeating step can include repeating the performing step if the results of the comparing step indicates that one or more of the NVM cells has a threshold voltage that exceeds the check voltage level. Further, the method can include counting a number of times the performing step is repeated, and indicating an erase failure if a maximum number of times has been reached. Still further, the performing step can be repeated only once before indicated an erase failure.

In further embodiments, before the indicating step, the method can include determining a number of NVM cells having threshold voltages that exceed the check voltage level, and indicating an erase failure if the number of NVM cells exceeds a threshold value. For another embodiment, before the erasing step, the performing step can further include pre-programming the NVM cells until the NVM cells have threshold voltages above a program verify voltage level. Also, before the comparing step, the method can further include determining whether an additional voltage check is enabled for the NVM system and skipping the comparing and repeating steps if the determining step indicates that the additional voltage check is not enabled.

In still further embodiments, the check voltage level can be larger than the erase verify voltage level by 200 millivolts or less. Also, the check voltage level can be lower than a read voltage level for the NVM system. Further, the check voltage level can be adjustable.

In another embodiment, a non-volatile memory (NVM) system is disclosed including an array of non-volatile memory (NVM) cells, and controller circuitry configured to perform an embedded erase operation for the NVM cells, to compare threshold voltages for the NVM cells to a check voltage level after the embedded erase operation, and to repeat the embedded erase operation depending upon results of the comparison, where the embedded erase operation includes an erase operation configured to cause the NVM cells to have threshold voltages below an erase verify voltage level and a soft programming operation configured to cause the NVM cells to have threshold voltages above a soft program verify voltage level, and where the check voltage level is higher than the erase verify voltage level.

In other embodiments, the controller circuitry can be configured to repeat the embedded erase operation if the results of the comparison indicate that one or more of the NVM cells has a threshold voltage that exceeds the check voltage level. Further, the controller circuitry can be further configured to count a number of times the embedded erase operation is repeated and to indicate an erase failure if a maximum number of times is reached. Still further, the maximum number of times can be one.

In further embodiments, the controller circuitry can be further configured to indicate an erase failure only if a number of NVM cells having threshold voltages that exceed the check voltage level exceeds a threshold value. For another embodiment, the embedded erase operation can further include a pre-programming operation configured to cause the NVM cells to have threshold voltages above a program verify voltage level. Also, the controller circuitry can be further configured to determine if an additional voltage check is enabled for the NVM system prior to repeating the embedded erase operation.

In still further embodiments, the check voltage level can be larger than the erase verify voltage level by 200 millivolts or less. Also, the check voltage level can be lower than a read voltage level for the NVM system. Further, the check voltage level can be adjustable.

It is noted that the functional blocks described herein can be implemented using hardware, software, or a combination of hardware and software, as desired. In addition, one or more processors running software and/or firmware can also be used, as desired, to implement the disclosed embodiments. It is further understood that one or more of the operations, tasks, functions, or methodologies described herein may be implemented, for example, as software or firmware and/or other program instructions that are embodied in one or more non-transitory tangible computer readable mediums (e.g., memory) and that are executed by one or more controllers, microcontrollers, microprocessors, hardware accelerators, and/or other processors to perform the operations and functions described herein.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. A method for erasing non-volatile memory (NVM) cells within an NVM system, comprising:
   performing an embedded erase operation for non-volatile memory (NVM) cells, comprising:
      erasing the NVM cells until the NVM cells have threshold voltages below an erase verify voltage level; and
      soft programming the NVM cells until the NVM cells have threshold voltages above a soft program verify voltage level;
   after the embedded erase operation is preformed, comparing the threshold voltages for the NVM cells to a check voltage level, the check voltage level being higher than the erase verify voltage level; and
   repeating the performing step based upon results of the comparing step.

2. The method of claim 1, wherein the repeating step comprises repeating the performing step if the results of the comparing step indicates that one or more of the NVM cells has a threshold voltage that exceeds the check voltage level.

3. The method of claim 2, further comprising performing the comparing step and the repeating step after each performing of the embedded erase operation, counting a number of times the performing step is repeated, and indicating an erase failure if a maximum number of times has been reached.

4. The method of claim 3, further comprising repeating the performing step only once before indicated an erase failure.

5. The method of claim 3, wherein before the indicating step, the method includes determining a number of NVM cells having threshold voltages that exceed the check voltage level, and indicating an erase failure if the number of NVM cells exceeds a threshold value.

6. The method of claim 1, wherein before the erasing step, the performing step further comprises pre-programming the NVM cells until the NVM cells have threshold voltages above a program verify voltage level.

7. The method of claim 1, wherein the check voltage level is larger than the erase verify voltage level by 200 millivolts or less.

8. The method of claim 1, wherein the check voltage level is lower than a read voltage level for the NVM system.

9. The method of claim 1, wherein the check voltage level is adjustable.

10. The method of claim 1, wherein before the comparing step, the method further comprises determining whether an additional voltage check is enabled for the NVM system and skipping the comparing and repeating steps if the determining step indicates that the additional voltage check is not enabled.

11. A non-volatile memory (NVM) system, comprising:
   an array of non-volatile memory (NVM) cells; and
   controller circuitry configured to perform an embedded erase operation for the NVM cells, to compare threshold voltages for the NVM cells to a check voltage level after the embedded erase operation, and to repeat the embedded erase operation depending upon results of the comparison;
   wherein the embedded erase operation comprises an erase operation configured to cause the NVM cells to have threshold voltages below an erase verify voltage level and a soft programming operation configured to cause the NVM cells to have threshold voltages above a soft program verify voltage level; and
   wherein the check voltage level is higher than the erase verify voltage level.

12. The NVM system of claim 11, wherein the controller circuitry is configured to repeat the embedded erase operation if the results of the comparison indicate that one or more of the NVM cells has a threshold voltage that exceeds the check voltage level.

13. The NVM system of claim 12, wherein the controller circuitry is further configured to compare threshold voltages and to repeat the embedded erase operation based upon the comparison after each embedded erase operation, to count a number of times the embedded erase operation is repeated and to indicate an erase failure if a maximum number of times is reached.

14. The NVM system of claim 13, wherein the maximum number of times is one.

15. The NVM system of claim 13, wherein the controller circuitry is further configured to indicate an erase failure only if a number of NVM cells having threshold voltages that exceed the check voltage level exceeds a threshold value.

16. The NVM system of claim 11, wherein the embedded erase operation further includes a pre-programming operation configured to cause the NVM cells to have threshold voltages above a program verify voltage level.

17. The m NVM system of claim 11, wherein the check voltage level is larger than the erase verify voltage level by 200 millivolts or less.

18. The NVM system of claim 11, wherein the check voltage level is lower than a read voltage level for the NVM system.

19. The NVM system of claim 11, wherein the check voltage level is adjustable.

20. The NVM system of claim 11, wherein the controller circuitry is further configured to determine if an additional voltage check is enabled for the NVM system prior to the comparison of threshold voltages for the NVM cells to the check voltage level.

21. The method of claim 1, further comprising repeating the comparing step if the performing step is repeated.

22. The method of claim 21, further comprising indicating an erase pass or an erase failure after the performing, comparing, and repeating steps.

23. The system of claim 11, wherein the controller circuitry is further configured to repeat a comparison of threshold voltages for the NVM cells to the check voltage level after a repeated embedded erase operation.

24. The system of claim 23, wherein the controller circuitry is further configured to indicate an erase pass or an erase failure after the embedded erase operation, comparison, and any repeated embedded erase operation and comparison.

* * * * *